United States Patent
Lien et al.

(10) Patent No.: US 7,921,400 B1
(45) Date of Patent: Apr. 5, 2011

(54) METHOD FOR FORMING INTEGRATED CIRCUIT DEVICE USING CELL LIBRARY WITH SOFT ERROR RESISTANT LOGIC CELLS

(75) Inventors: Chuen-Der Lien, Los Altos Hills, CA (US); Shih-Ked Lee, Fremont, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 72 days.

(21) Appl. No.: 12/478,734

(22) Filed: Jun. 4, 2009

Related U.S. Application Data

(62) Division of application No. 11/186,492, filed on Jul. 20, 2005, now abandoned.

(51) Int. Cl.
  *G06F 9/45* (2006.01)
  *G06F 17/50* (2006.01)
(52) U.S. Cl. .................................... 716/132; 716/139
(58) Field of Classification Search .............. 716/2, 132, 716/139
  See application file for complete search history.

(56) References Cited

U.S. PATENT DOCUMENTS

| | | |
|---|---|---|
| 4,641,165 A | 2/1987 | Lizuka et al. |
| 4,805,147 A | 2/1989 | Yamanake et al. |
| 4,864,539 A | 9/1989 | Chaung et al. |
| 5,128,745 A | 7/1992 | Takasu et al. |
| 5,324,982 A | 6/1994 | Nakazato et al. |
| 5,572,460 A | 11/1996 | Lien |
| 5,644,155 A | 7/1997 | Lien |
| 5,681,769 A | 10/1997 | Lien |
| 5,691,652 A | 11/1997 | Miller |
| 5,710,070 A | 1/1998 | Chan |
| 5,825,686 A | 10/1998 | Schmitt-Landsiedl et al. |
| 6,472,715 B1 | 10/2002 | Liu et al. |
| 6,580,130 B1 | 6/2003 | Schoellkopf et al. |
| 6,621,146 B1 | 9/2003 | Bowman |
| 6,649,456 B1 | 11/2003 | Liaw |
| 6,703,858 B2 | 3/2004 | Knowles |
| 6,754,093 B2 | 6/2004 | Lien |
| 2002/0195661 A1 | 12/2002 | Ueda |
| 2004/0100320 A1 | 5/2004 | Nelson et al. |
| 2004/0230935 A1* | 11/2004 | Samudrala et al. .............. 716/17 |

(Continued)

OTHER PUBLICATIONS

The Design of Radiation-Hardened ICs for Space: A Compendium of Approaches, S. Kern and B.D. Shafer, Proceedings of the IEEE, vol. 76, No. 11, pp. 1470-1509, 1994.

(Continued)

*Primary Examiner* — Jack Chiang
*Assistant Examiner* — Suresh Memula
(74) *Attorney, Agent, or Firm* — Kenneth Glass; Glass & Associates

(57) ABSTRACT

A cell library is disclosed that includes soft error resistant logic cells. The soft error resistant logic cells can be used along with memory cells and conventional logic cells to form integrated circuit designs having increased soft error resistance. A method for forming an integrated circuit device is disclosed in which a first integrated circuit design is formed using conventional logic cells. An iterative process is then performed in which some of the conventional logic cells are replaced with high soft error resistant logic cells to obtain a soft error resistant design. Each soft error resistant logic cell that replaces a corresponding conventional logic cell will have the same cell size as the cell that is replaced, producing a soft error resistant design that does not take up additional surface area on the semiconductor substrate.

20 Claims, 5 Drawing Sheets

U.S. PATENT DOCUMENTS

| | | | |
|---|---|---|---|
| 2004/0259295 | A1 | 12/2004 | Tomiye et al. |
| 2005/0083726 | A1 | 4/2005 | Auclair et al. |
| 2005/0098835 | A1 | 5/2005 | Ushiroda et al. |
| 2005/0127419 | A1 | 6/2005 | Hashimoto |
| 2005/0141265 | A1 | 6/2005 | Yokoyama |
| 2005/0158951 | A1 | 7/2005 | Jang |
| 2006/0063324 | A1 | 3/2006 | Park et al. |
| 2006/0086989 | A1 | 4/2006 | Lee et al. |
| 2006/0134854 | A1 | 6/2006 | Park et al. |
| 2007/0006109 | A1* | 1/2007 | Bartling et al. .............. 716/11 |

OTHER PUBLICATIONS

A Proposed New Structure for SEU Immunity in SRAM Employing Drain Resistance, A. Ochoa, Jr et al, IEEE electron device letter No. 11, pp. 537-539, 1987.

Experimental Determination of Time Constants for Ion-Induced Transients in Static Memories, H. Weaver et al, IEEE transaction on electron devices vol. 35, No. 7, pp. 1116-1119, 1988.

A New Soft Error Immune Static Memory Cell, M. Minami et al, 1988 Symposium on VLSI Technology, pp. 57-58, 1988.

Soft Error Protection Using Asymmetric Response Latches, H. Weaver, IEEE transcation on electron devices vol. 38, No. 6, pp. 1555-1557, 1991.

Robust System Design with Built-In Soft Error Resilence, S. Mitra et al., IEEE Computer Society Publication, pp. 43-52, Feb. 2005.

Ohsono; A Radiation-Hardened CMOS 177k Gate Array Having Libraries Compatible With Commerical Ones; 1994; National Space Development Agency of Japan; pp. 37-40.

* cited by examiner

METHOD FOR FORMING INTEGRATED CIRCUIT DEVICE USING CELL LIBRARY WITH SOFT ERROR RESISTANT LOGIC CELLS

FIELD OF THE INVENTION

The present invention relates to the field of semiconductor devices. More specifically, the present invention relates to semiconductor devices and methods for forming semiconductor devices.

BACKGROUND ART

When high energy particles such as alpha particles pass through semiconductor devices they can cause soft errors to occur. Soft errors are particularly problematic in memory devices such as DRAM and SRAM memory cells. When a high energy particle passes through a node of a memory cell that is storing charge (e.g., a DRAM or SRAM memory cell), if the energy of the particle is sufficiently strong or if the capacitance is too small, the node can be effectively discharged. This can reverse the stored logic state of the memory cell (e.g., the cell can be flipped from storing a logic "1" to a logic "0"). The resulting error is typically referred to as a "soft error."

The issue of soft errors in memory cells has been studied in depth and many solutions have been developed for decreasing the soft error rate of memory cells. However, high energy particles can also cause soft errors in logic devices. The movement toward higher device densities and lower device voltages has led to a corresponding increase in likelihood for soft errors to occur in logic devices.

During the design of a semiconductor device, cells from a cell library are combined to form a design that performs the desired function. Though conventional standard cell libraries include numerous devices, some of which will have higher soft error rate than others, it is difficult to design logic that has high soft error resistance. More particularly, since the cells in standard cell libraries are typically designed for speed and not soft error resistance, the standard cell library may not include a particular type of logic device having the desired soft error resistance.

Accordingly, there is a need for a cell library that allows for easily forming designs having increased soft error resistance. Also, there is a need for a method and apparatus that reduce the occurrence of soft errors in logic devices. The method and apparatus of the present invention meets the above needs.

DISCLOSURE OF THE INVENTION

A cell library is disclosed that includes soft error resistant logic cells. By including soft error resistant logic cells in the cell library, integrated circuit designs can be easily formed having increased soft error resistance.

Methods for forming integrated circuit devices are disclosed in which both standard logic cells and soft error resistant logic cells are used to form soft error resistant designs. In one method a first integrated circuit design is formed using standard logic cells. An iterative process is then performed in which standard logic cells are replaced with high soft error resistant logic cells in a way that does not increase the delay of the critical path.

In the present embodiment the soft error resistant logic cells have the same size as corresponding logic cells in the standard cell library. Accordingly, the soft error resistant design does not take up additional surface area on the semiconductor substrate. These and other advantages of the present invention will no doubt become obvious to those of ordinary skill in the art after having read the following detailed description of the preferred embodiments, which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Figure 1:
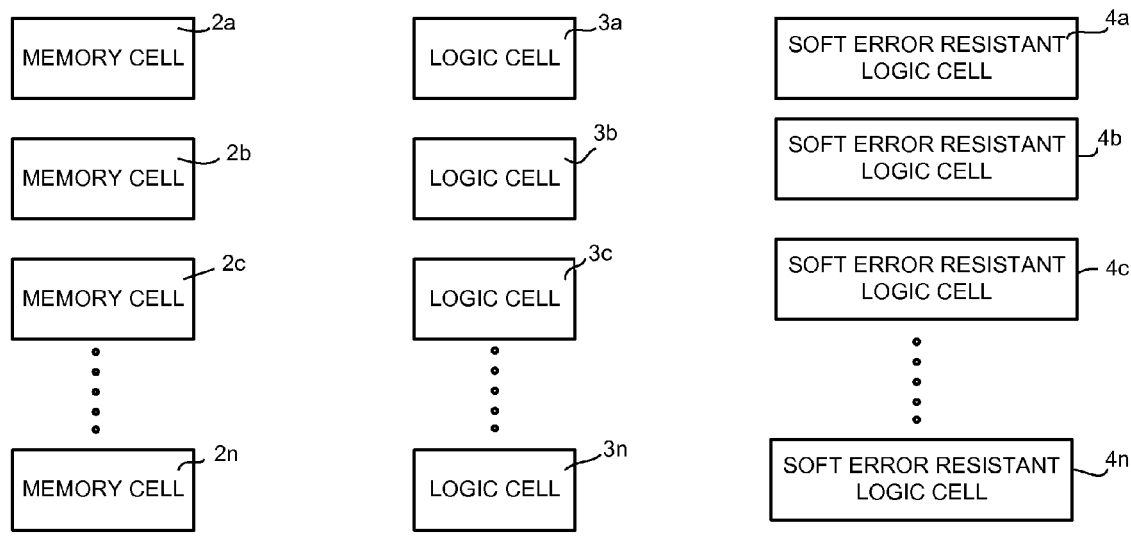
FIG. 1 is a diagram that illustrates cells of a standard cell library that includes memory cells, a set of conventional logic cells and a set of soft error resistant logic cells in accordance with one embodiment of the present invention.

FIG. 1 shows some of the cells of a cell library 10 that can be used for generating an integrated circuit design. Cell library 10 includes logic cells 3a-4n, and cells 2a-2n that are not logic cells. In the present embodiment cells 2a-2n are memory cells such as SRAM or DRAM memory cells.

A first set of logic cells, shown as logic cells 3a-3n are conventional logic cells, each of which performs a particular logic function. Logic cells 3a-3n can be cells from an open source cell library or a proprietary cell library and can include logic cells that perform any of a number of different logic functions. Cell library 10 also includes a second set of logic cells, shown as soft error resistant logic cells 4a-4n. Soft error resistant logic cells 4a-4n are cells that have high soft error resistance.

In the present embodiment each soft error resistant logic cell 4a-4n performs the same function as a corresponding conventional logic cell 3a-3n and has a higher soft error resistance than the corresponding conventional logic cell 3a-3n that performs the same logic function. More particularly, soft error resistant logic cell 4a performs the same function as conventional logic cell 3a and has higher soft error resistance than logic cell 3a. Soft error resistant logic cell 4b performs the same function as conventional logic cell 4b and has higher soft error resistance than logic cell 3b; and soft error resistant logic cell 4c performs the same function as conventional logic cell 3c and has higher soft error resistance than logic cell 3c. Similarly, soft error resistant logic cell 4n performs the same function as conventional logic cell 3n and has higher soft error resistance than logic cell 3n. It is appreciated that cell library 10 can include any number of memory cells 2a-2n, conventional logic cells 3a-3n and soft error resistant logic cells 4a-4n and can have more conventional logic cells 3a-3n than soft error resistant logic cells 4a-4n. In addition to performing the same function, in the present embodiment corresponding logic cells have the same cell size (both cell height and cell width). In addition, in one embodiment some or all of the corresponding logic cells have the same drive strength and the same voltage threshold.

Because each soft error resistant logic cell 4a-4n has a higher soft error resistance than the corresponding conventional logic cell 3a-3n, it will be less likely to suffer from a soft-error-upset than a corresponding conventional logic cell 3a-3n, giving it a lower soft error rate than the soft error rate of the corresponding conventional logic cell 3a-3n.

Cells from cell library 10 can be combined so as to obtain an integrated circuit design. This can be done using high-level logic that is converted into the desired integrated circuit design using an automated process. Alternatively, some or all of the design could be generated by manually selecting and placing cells from cell library 10 to form the desired integrated circuit design.

In one embodiment each soft error resistant logic cell 4a-4n includes the same electronic components as the corresponding conventional logic cell 3a-3n. Accordingly each soft error resistant logic cells 4a-4n will not include any additional electronic components as compared to its corresponding conventional logic cell 3a-3n. Alternatively, soft error resistant logic cells 4a-4n can include additional electronic components such as capacitors or resistors to improve soft error rate as long as the additional electronic components can be added without increasing the cell size. Since the soft error resistant logic cells of the present invention have the same size as the corresponding logic cell, the methods and apparatus of the present invention do not take up additional surface area on the semiconductor substrate.

There are a variety of different methods that can be used to form logic cells that have high soft error resistance. In one embodiment only the implant processes of the cell are changed. More particularly, either the doping concentration or implant energy are changed, or additional implant process steps are added, so as to form structures within the semiconductor substrate that increase the cell's resistance to soft errors.

Figure 2:
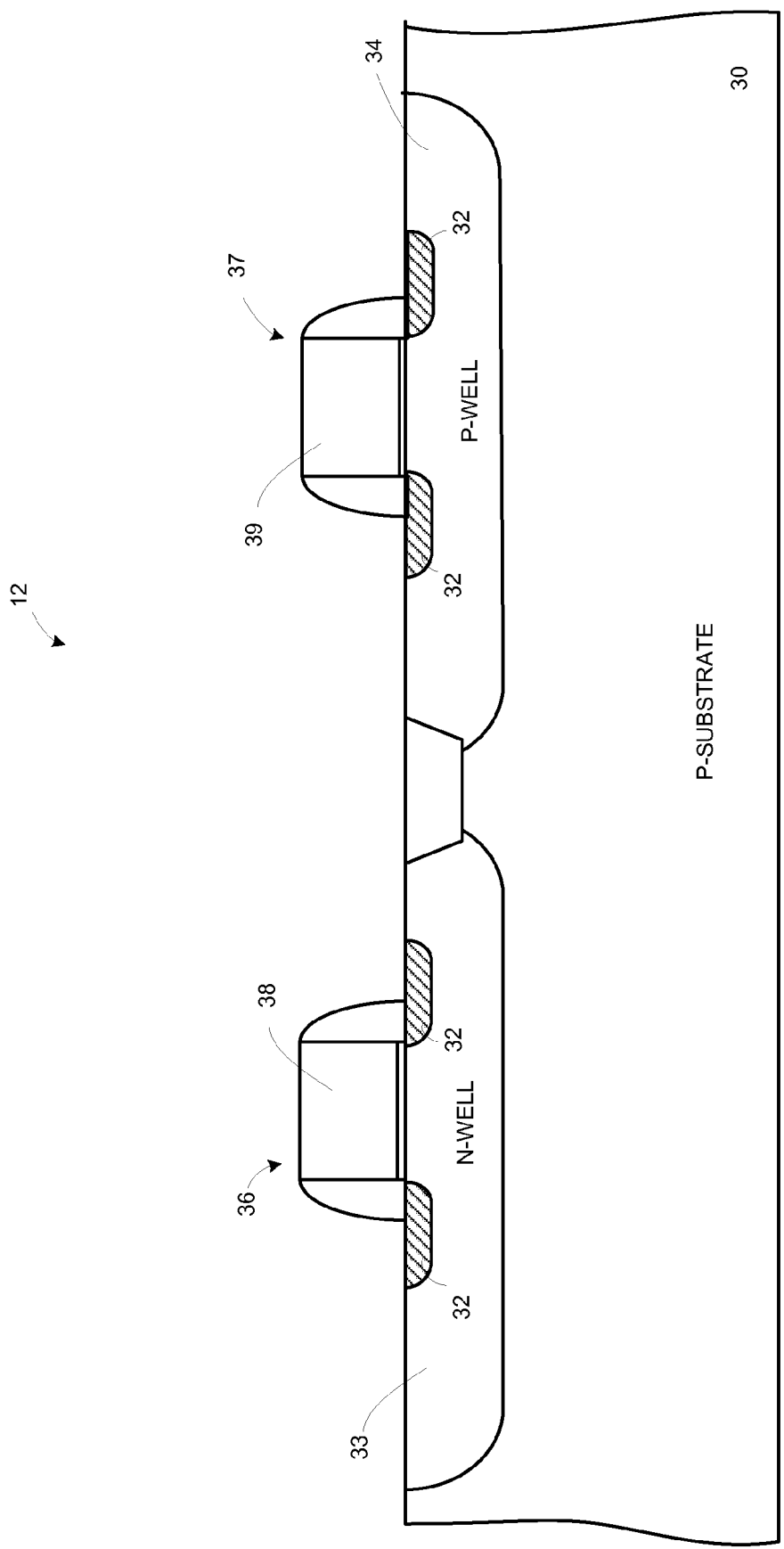
FIG. 2 is a diagram that shows an n-channel semiconductor device and a p-channel semiconductor device that are formed on a semiconductor substrate using a logic cell from a cell library that includes both conventional logic cells and soft error resistant logic cells in accordance with one embodiment of the present invention.

In the embodiment that is illustrated in FIG. 2 a conventional logic cell 3a is used in a semiconductor fabrication process to form structure 12 on p-type semiconductor substrate 30. Structure 12 includes p-channel device 36 and n-channel device 37. P-channel device 36 includes gate electrode 38 and source and drain regions 32 that are formed in n-well 33. N-channel device 37 includes gate electrode 39 and source and drain regions 32 that are formed in p-well 34.

Figure 3:
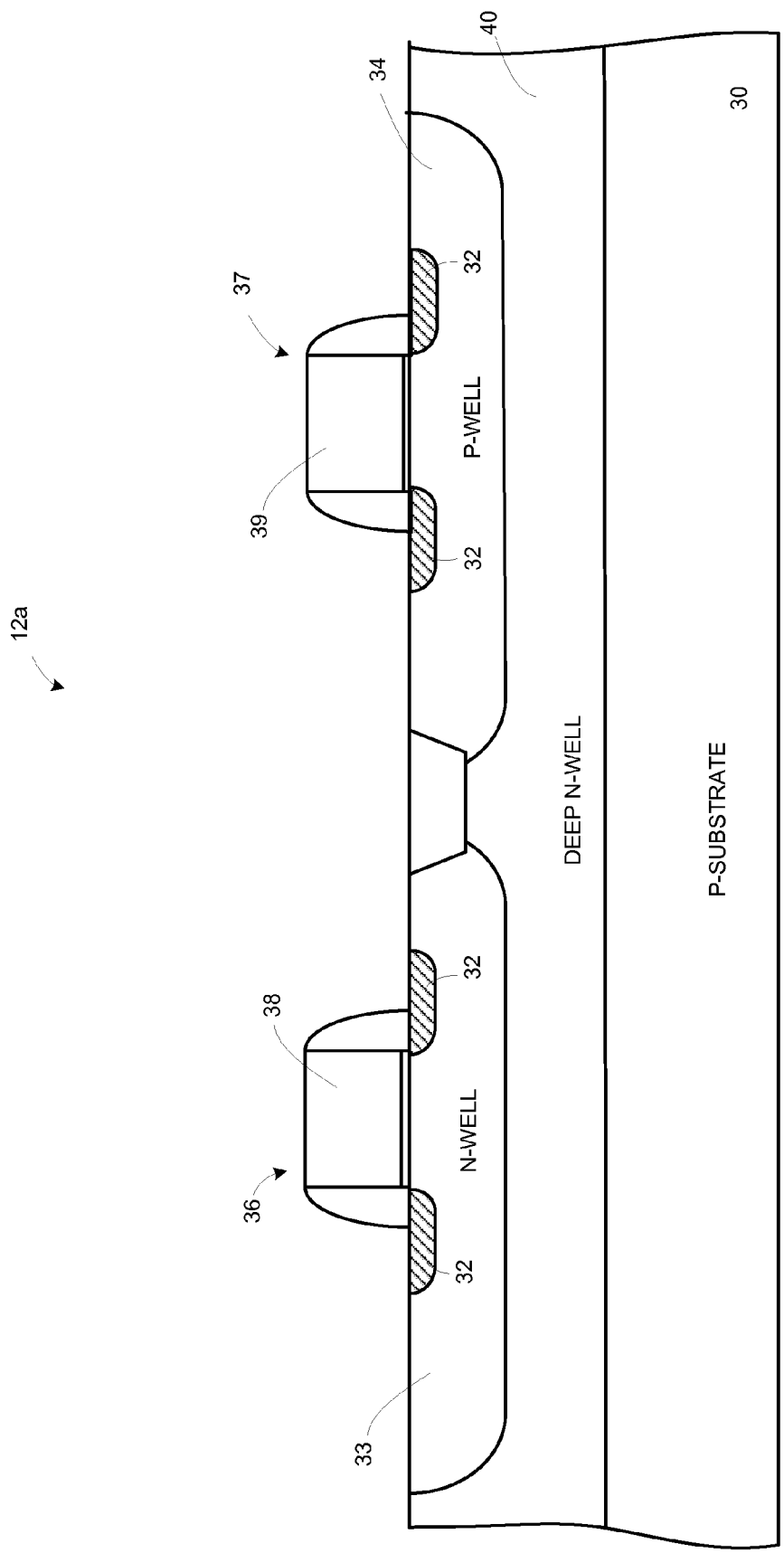
FIG. 3 is a diagram that shows an n-channel semiconductor device and a p-channel semiconductor device that are formed on a semiconductor substrate using a soft error resistant logic cell that corresponds to the conventional logic cell of FIG. 2 in accordance with one embodiment of the present invention.

In the embodiment that is illustrated in FIG. 3 a soft error resistant logic cell 4a is used in a semiconductor fabrication process so as to form structure 12a on semiconductor substrate 30. In the present embodiment structure 12a is formed in the same manner as structure 12 except that an additional implant process is performed so as to form deep n-well 40. Deep n-well 40 extends under n-well 33 and p-well 34. The portion of the n-type doped layer 40 that extends between p-type well region 34 and the p-type semiconductor substrate attracts electron-hole pairs formed by alpha particles, thereby preventing soft errors. In addition, deep n-well 40 isolates p-well 34 from p-substrate 30, reducing the charge collection volume of p-well 34. More particularly, referring now to FIG. 2, without deep n-well 40, p-well 34 is connected to p-substrate 30 such that the whole substrate 30 can contribute to free carriers. The addition of deep n-well 34 isolates p-well 34 from p-substrate 30, forming pockets of p-wells 34 having reduced charge collection volume. This reduction in charge collection volume reduces the soft error rate of device 12a. Accordingly, structure 12a is a soft error resistant structure as compared to structure 12, and it will have a lower soft error rate than corresponding structure 12.

When the substrate is an n-type substrate and the logic device includes a p-channel transistor having a p-doped storage region formed in an n-type well, a p-type deep implant can be used to increase the soft error resistance of the logic cell. More particularly, a p-type implant is performed to form a p-type doped region that extends between the n-type well and the n-type substrate.

In one specific embodiment soft error resistant logic cells are formed in the same manner as disclosed in U.S. Pat. No. 6,754,093 titled "CAM CIRCUIT WITH RADIATION RESISTANCE" by Chuen-Der Lien, which is hereby incorporated by reference in its entirety. In this embodiment the soft error resistant logic cells can either be formed using a p-type implant or using a n-type implant, depending on the type of substrate being used.

In another embodiment soft error resistant logic cells are formed by increasing capacitance of existing structures in the logic cell without increasing the logic cell size. This can be done using any of a number of different techniques that are well known in the art including, for example, adding additional trench capacitors or plate capacitors to the logic cell. This forms a soft error resistant logic cell that has a higher capacitance than the corresponding conventional logic cell.

In one embodiment the capacitance is increased by altering the implant process steps so as to form a "Miller" capacitor between the drain and gate electrode. According to the Miller effect, the effective capacitance of a Miller capacitor equals the actual capacitance multiplied by the transistor gain. In one embodiment an asymmetrical source/drain structure is formed that includes a drain region that extends laterally under the gate electrode to a distance greater than the source region such that a non-parasitic capacitance exists between the drain and gate electrode. The asymmetrical source/drain structure can be formed in the same manner as disclosed in U.S. Pat. No. 5,572,460 titled STATIC RANDOM-ACCESS MEMORY CELL WITH CAPACITIVE COUPLING TO REDUCE SENSITIVITY TO RADIATION, by Chuen-Der Lien, which is hereby incorporated by reference in its entirety. By adding a Miller capacitor to the transistor(s) of the logic cell, the soft error resistance of the logic cell is increased without adding any additional electronic components to the cell and without increasing the cell size.

In another embodiment soft error resistant logic cells are formed by reducing the junction area pf the p-n junction using techniques that are well known in the art.

Figure 4:
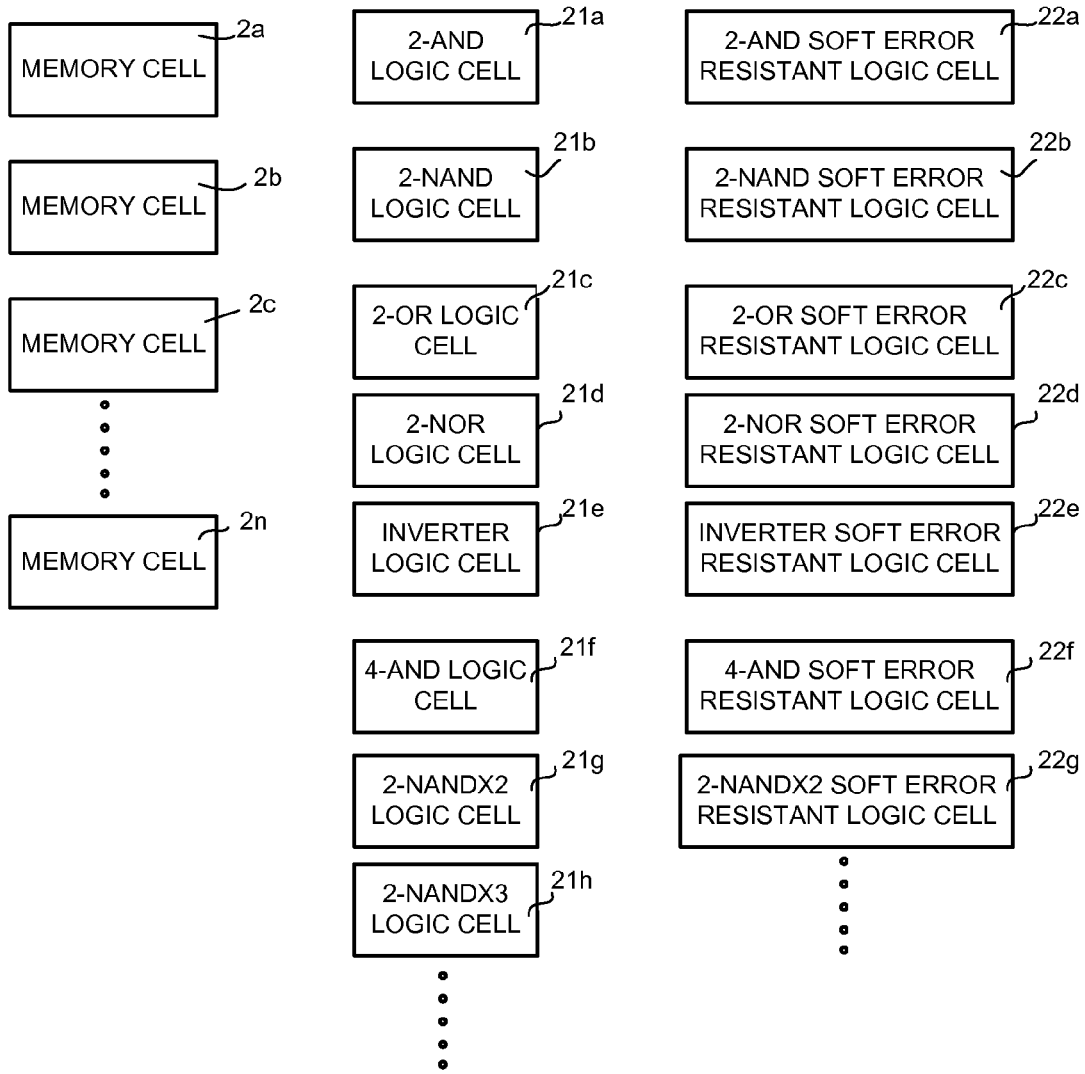
FIG. 4 is a diagram that illustrates exemplary cells of a cell library that includes memory cells, a set of conventional logic cells and a set of soft error resistant logic cells in accordance with one embodiment of the present invention.

FIG. 4 shows an exemplary cell library 20 that includes logic cells 21a-h and soft error resistant logic cells 22a-g. Logic cells 21a-h are conventional logic cells that are used to perform various different logic functions. More particularly, 2-AND logic cell 21a is a two-input cell that performs an "and" function, 2-NAND logic cell 21b is a two-input cell that performs a "not-and" function. Similarly, 2-OR logic cell 21c is a two-input cell that performs an "or" function, 2-NOR logic cell 21d is a two-input cell that performs a "not-or" function. Inverter logic cell 21e is a logic cell that inverts the received input signal and 4-AND logic cell 21f is a four-input logic cell that performs an "and" function. In the present embodiment logic cells 21a-21f are x1 drive strength and 2-NANDx2 logic cell 21g is a two-input NAND logic cell with an x2 (double) drive strength. Logic cell 21h is a (2-NANDx3) two-input NAND logic cell with an x3 (triple) drive strength.

Cell library 20 also includes soft error resistant logic cells 22a-g. Each soft error resistant logic cell 22a-g has a higher soft error resistance than the corresponding conventional logic cell 21a-g that performs the same logic function. More particularly, soft error resistant 2-AND logic cell 21a is a two-input cell that performs an "and" function and that has higher soft error resistance than corresponding 2-AND logic cell 21a. Soft error resistant 2-NAND cell 22b is a two-input cell that performs a "not-and" function and that has higher soft error resistance than corresponding 2-NAND logic cell 21b. Similarly, soft error resistant 2-OR logic cell 22c is a two-input cell that performs an "or" function and that has higher soft error resistance than corresponding 2-OR logic cell 21c. Soft error resistant 2-NOR logic cell 22d is a two-input cell that performs a "not-or" function and that has higher soft error resistance than corresponding 2-NOR logic cell 21d. Soft error resistant INVERTER logic cell 22e is a logic cell that inverts the received input signal and that has higher soft error resistance than corresponding INVERTER logic cell 21e. Soft error resistant 4-AND logic cell 22f is a four-input logic cell that performs an "and" function and that has higher soft error resistance than corresponding 4-AND logic cell 21f. In the present embodiment soft error resistant logic cells 22a-22f are x1 drive strength and soft error resistant 2-NANDx2 logic cell 22g is a two-input cell that performs a "not-and" function, having an x2 (double) drive strength, that has higher soft error resistance than corresponding 2-NANDx2 logic cell 21g.

In the present embodiment each soft error resistant cell 22a-g has the same size as the corresponding conventional logic cell 21a-g that performs the same logic function. More particularly, soft error resistant 2-AND logic cell 22a has the same size as corresponding 2-AND logic cell 21a. Soft error resistant 2-NAND logic cell 22b has the same size as corresponding 2-NAND logic cell 21b. Also, soft error resistant 2-OR logic cell 22c has the same size as corresponding 2-OR logic cell 21c; and soft error resistant 2-NOR logic cell 22d has the same size as corresponding 2-NOR logic cell 21d. Similarly, soft error resistant INVERTER logic cell 22e has the same size as corresponding INVERTER logic cell 21e; soft error resistant 4-AND logic cell 22f has the same size as corresponding 4-AND logic cell 21f; and soft error resistant 2-NANDx2 logic cell 22g has the same size as corresponding 2-NANDx2 logic cell 21g. Because each soft error resistant logic cell 22a-g has the same size as the corresponding conventional logic cell 21a-g, the use of soft error resistant cells 22a-g in place of conventional logic cells 21a-g does not take up any more space on the surface of the fabricated semiconductor wafer.

In addition to performing the same function and having the same cell size, in one embodiment some or all of the corresponding logic cells have the same drive strength and the same voltage threshold.

In the present embodiment each soft error resistant logic cell 22a-g is designated as being a soft error resistant cell and conventional logic cells 21a-h are not designated as being soft error resistant cells. This designation can be included in the cell name, in the definitions of individual cell properties or otherwise in the cell library documentation. This designation can be by indicating that the cell is "soft error resistant," "soft error hardened," has a "low soft error rate," etc.

Figure 5:
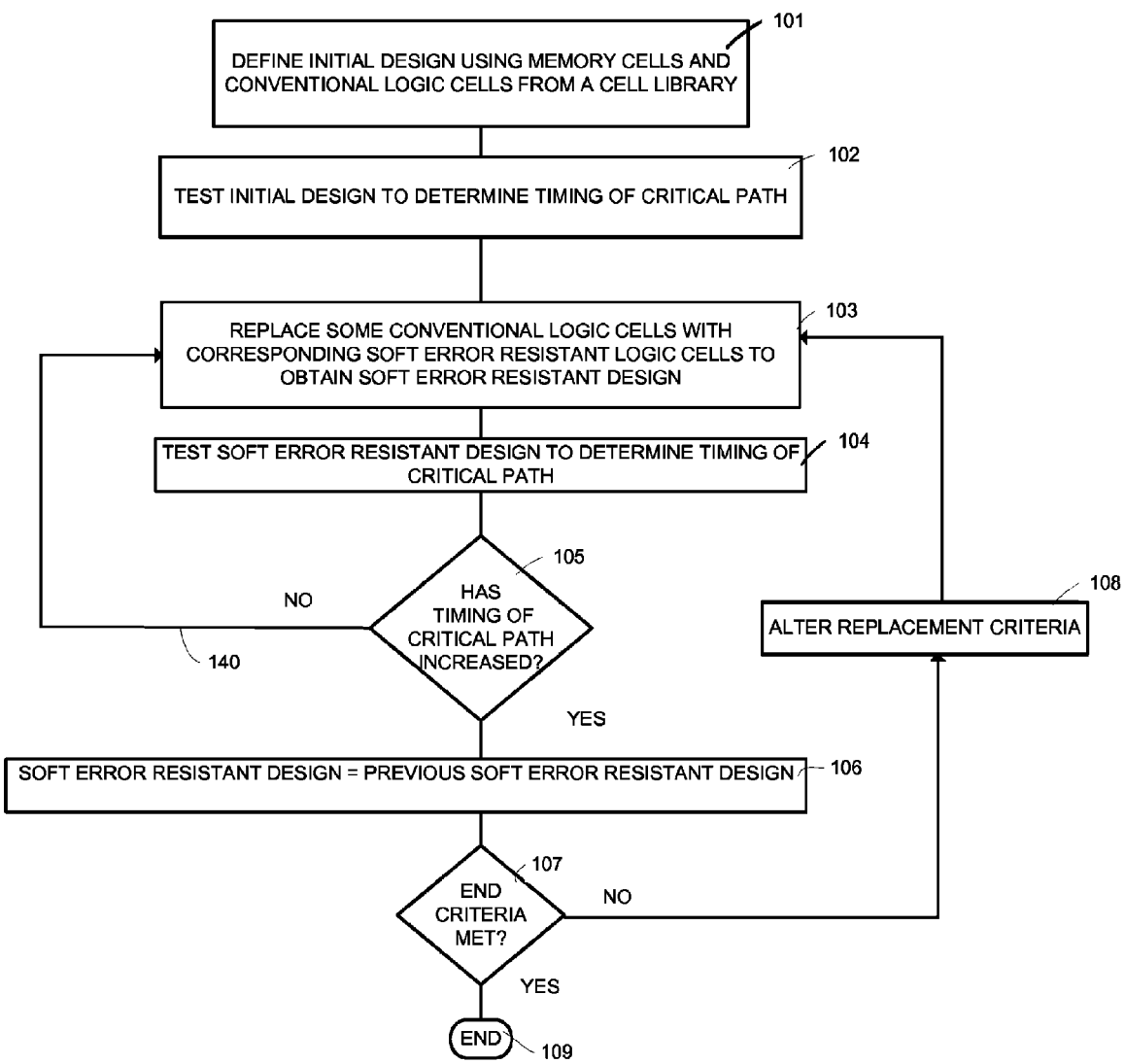
FIG. 5 is a flow chart that illustrates a method for forming an integrated circuit design using a cell library that includes conventional logic cells and soft error resistant logic cells in accordance with one embodiment of the present invention.

Cells from cell library 20 can be combined either using an automated program or manually to form an integrated circuit design to be used for forming semiconductor devices. In the embodiment shown in FIG. 5, a method for forming an integrated circuit design is illustrated in which the design is first generated (step 101) using conventional logic cells and memory cells from a cell library. For example, using cell library 20, conventional logic cells 21a-h and memory cells 2a-2n are combined so as to form an initial integrated circuit design. In addition, the integrated circuit design can include custom or standard memory components that are not included in the cell library such as, for example, a custom memory core. This initial integrated circuit design will not include any soft error resistant logic cells 22a-22g. The design is then tested as shown by step 102 to determine timing of the critical path. Any of a number of different testing methods, which are well known in the art, can be used to determine critical path. In the present embodiment a netlist is generated from the initial integrated circuit design and an automated computer testing program is run on the netlist to determine timing of the critical path.

Some of the cells in the initial integrated circuit design are then replaced with corresponding soft error resistant logic cells from the cell library as shown by step 103. In the embodiment of FIG. 2, some of logic cells 21a-21g are replaced by a corresponding soft error resistant logic cell 22a-g. For example, when the initial integrated circuit design includes 2-AND logic cells 21a, some of the 2-AND logic cells 21a can be replaced with 2-AND soft error resistant logic cells 22a. Though this replacement could be done manually, in the present embodiment a computer program is used that automatically replaces conventional cells 21a-g with soft error resistant logic cells 22a-g. Because the resulting soft error resistant design includes soft error resistant cells 22a-g it will have a higher soft error resistance than the initial design.

The resulting soft error resistant design is then tested as shown by step 104 to determine timing of the critical path. If the cell replacement of step 103 does not increase the timing of the critical path more replacements are made as shown by arrow 140 and step 105. The new soft error resistant design is then tested as shown by step 104 to determine timing of the critical path. This process is repeated as shown by arrow 140 and steps 103-105 as long as the replacement process does not impact the timing of the critical path, with each replacement generating a soft error resistant design that has higher soft error resistance than the previous design.

When step 105 indicates that the replacement process of step 103 has increased the timing of the critical path, the replacement process is continued as shown by steps 106-108 using the previous soft error resistant design. More particularly, when the replacement process of step 103 results in a soft error resistant design that increases the timing of the critical path (reducing the device speed), the resulting soft error resistant design is no longer used. Instead, as shown by step 106, the process reverts to the previous soft error resistant design. Because this previous soft error resistant design did not result in an increase in critical path timing, the required critical path timing will be maintained. The replacement process then continues as shown by steps 107 and 108 using altered replacement criteria. In the present embodiment the replacement criteria are altered by not replacing some or all of the cells that resulted in the increase in critical path timing (those cells that were replaced in the previous step 103). Accordingly, in each subsequent iteration the cells that result in the increase in critical path timing are eliminated from the replacement process, resulting in subsequent soft error resistant designs having improved soft error resistance.

In one embodiment the replacement criteria are altered by not replacing any of the cells that resulted in the timing increase in the critical path (those cells that were replaced in the previous step 103) in subsequent replacement steps 103. Accordingly, in each subsequent iteration the cells that resulted in the increase in critical path timing are eliminated from the replacement process, creating subsequent soft error resistant designs having improved soft error resistance that do not negatively impact device speed.

Once the end criteria of step 107 have been met the process ends as shown by step 109. In one embodiment the end criteria is based on whether or not all cells have been tested. If all cells have not yet been tested the process continues until all cells have been tested. This produces a soft error resistant design in which all cells that do not result in changes to critical path timing are replaced and all cells that increase timing of the critical path timing are not replaced. The resulting soft error resistant design can then be used in a semiconductor fabrication process for forming semiconductor devices having increased soft error resistance.

In one specific embodiment only one cell is replaced in each replacement step 103. In this embodiment test 104 is performed after each cell replacement. If the cell does not increase timing of the critical path, another cell is replaced as shown by arrow 140. This process continues until the replacement increases critical path timing (step 105). When the cell replacement increases critical path timing, the previous soft error resistant design is used (which does not include the cell that resulted in the change to critical path timing) and the replacement criteria is altered to exclude that cell (the cell that resulted in the change to the critical path timing) from the replacement process. This process continues until all cells have been tested, with all cells that do not result in changes to critical path timing being replaced and all cells that increase timing of the critical path timing not being replaced. The resulting design will have high soft error resistance and will have the same device speed as the original design.

In one embodiment the steps of method 100 are performed automatically using a software program that is operable on a computer. In the present embodiment replacement criteria and end criteria are input prior to executing the software program, providing a revised integrated circuit design having high soft error resistance.

The soft error resistant design that is produced in accordance with method 100 will have the same size and the same number of cells as the initial design generated in step 101. However it will have higher soft error resistance than the initial design generated in step 101. Accordingly, the soft error resistant design will produce an integrated circuit device on a semiconductor substrate having the same size as would be formed using the initial design generated in step 101.

Moreover, as the methods and apparatus of the present invention use cell substitution to create a soft error resistant design, there is no need to add additional electronic circuits or components (either in the form of additional cells or custom circuitry) to the integrated circuit design. Thereby, the die size and device density of the original design is maintained.

Although method 100 only tests the design based on critical path, it is appreciated that other test parameters could also be used to assure that the replacement process does not negatively affect the design. For example, heat generation models could be used to determine whether the replacement process negatively affects the temperature profile of the design. The present invention is intended to cover all such alternative embodiments.

The preferred embodiment of the present invention is thus described. While the present invention has been described in particular embodiments, it should be appreciated that the present invention should not be construed as limited by such embodiments, but rather construed according to the following claims.

What is claimed is:

1. A method for generating an integrated circuit design comprising:
   selecting, on a computer, logic cells from a cell library so as to define a first integrated circuit design, the cell library including a first set of logic cells and a second set of logic cells, each cell in the second set of logic cells having a higher soft error resistance than a corresponding cell in the first set of logic cells, each cell in the second set of logic cells performing the same function as the corresponding cell in the first set of logic cells and each cell in the second set of logic cells having the same cell size as the corresponding cell in the first set of logic cells, the first integrated circuit design including logic cells from the first set of logic cells and not including logic cells from the second set of logic cells; and
   generating, on the computer, a soft error resistant design by replacing some of the logic cells in the first integrated circuit design with corresponding logic cells in the second set of logic cells, the soft error resistant design having higher soft error resistance than the first integrated circuit design, having the same number of logic cells as the first integrated circuit design and each replaced logic cell in the first integrated circuit design replaced by a corresponding cell in the second set of logic cells that has the same function and the same cell size.

2. The method of claim 1 wherein the soft error resistant design does not have any additional electronic components as compared to the first integrated circuit design.

3. The method of claim 2 wherein some of the cells in the second set of logic cells have higher capacitance than the corresponding cell in the first set of logic cells.

4. The method of claim 3 wherein some of the cells in the second set of logic cells include Miller capacitors and wherein corresponding cells in the first set of logic cells do not include Miller capacitors.

5. The method of claim 1 wherein some of the cells in the second set of logic cells include deep implant regions and wherein corresponding cells in the first set of logic cells do not include the deep implant regions.

6. The method of claim 1 wherein some of the cells in the second set of logic cells have the same threshold voltage as the corresponding cell in the first set of logic cells.

7. The method of claim 6 wherein some of the cells in the second set of logic cells have the same drive strength as the corresponding cell in the first set of logic cells.

8. The method of claim 1 wherein all of the cells in the second set of logic cells have approximately the same threshold voltage and approximately the same drive strength as the corresponding cell in the first set of logic cells.

9. The method of claim 1 wherein the generating a soft error resistant design is performed by a computer program stored on a non-transitory computer-readable medium that is executable by a computer, the computer program operable to use replacement criteria and end criteria to generate the soft error resistant design.

10. A method for generating an integrated circuit design comprising:
- selecting, on a computer, logic cells from a cell library so as to define a first integrated circuit design, the cell library including a first set of logic cells and a second set of logic cells, each cell in the second set of logic cells having a higher soft error resistance than a corresponding cell in the first set of logic cells, each cell in the second set of logic cells performing the same function as the corresponding cell in the first set of logic cells and each cell in the second set of logic cells having the same cell size as the corresponding cell in the first set of logic cells, the first integrated circuit design including logic cells from the first set of logic cells and not including logic cells from the second set of logic cells; and
- generating, on the computer, a soft error resistant design that has critical path timing that is not greater than the critical path timing of the first integrated circuit design, by replacing some of the logic cells in the first integrated circuit design with corresponding logic cells in the second set of logic cells and testing the soft error resistant design to determine whether the critical path timing of the soft error resistant design is greater than the critical path timing of the first integrated circuit design, the soft error resistant design having higher soft error resistance than the first integrated circuit design, having the same number of logic cells as the first integrated circuit design and each replaced logic cell in the first integrated circuit design replaced by a corresponding cell in the second set of logic cells that has the same function and the same cell size.

11. A method as recited in claim 10 wherein the generating a soft error resistant design that has critical path timing that is not greater than the critical path timing of the first integrated circuit design further comprises performing the following steps on the computer:
- replacing some of the logic cells in the first integrated circuit design with corresponding logic cells in the second set of logic cells;
- testing to determine whether critical path timing is greater than the critical path timing of the first integrated circuit design; and
- continuing to perform the replacing and the testing until the testing indicates that the critical path timing is greater than the critical path timing of the first integrated circuit design.

12. A method as recited in claim 11 further comprising forming an integrated circuit device using the soft error resistant design that has critical path timing that is not greater than the critical path timing of the first integrated circuit design.

13. The method of claim 12 wherein the soft error resistant design that has critical path timing that is not greater than the critical path timing of the first integrated circuit design is the soft error resistant design that is generated immediately prior to the soft error resistant design that has critical path timing that is greater than the critical path timing of the first integrated circuit design.

14. A method as recited in claim 10 wherein the generating a soft error resistant design that has critical path timing that is not greater than the critical path timing of the first integrated circuit design further comprises performing the following steps on the computer:
- replacing some of the logic cells in the first integrated circuit design with corresponding logic cells in the second set of logic cells;
- testing to determine whether critical path timing is greater than the critical path timing of the first integrated circuit design;
- continuing to perform the replacing and the testing until the testing indicates that the critical path timing is greater than the critical path timing of the first integrated circuit design; and
- after the testing indicates that the critical path timing is greater than the critical path timing of the first integrated circuit design:
  - altering replacement criteria, and
  - continuing to replace some of the logic cells in the first integrated circuit design with corresponding logic cells in the second set of logic cells using the altered replacement criteria and continuing to test whether critical path timing is greater than the critical path timing of the first integrated circuit design until the testing indicates that the critical path timing is greater than the critical path timing of the first integrated circuit design.

15. A method as recited in claim 10 wherein the first integrated circuit design includes a memory core and wherein the generated soft error resistant design that has critical path timing that is not greater than the critical path timing of the first integrated circuit design includes the same memory core.

16. A method for generating an integrated circuit design comprising:
- selecting, on a computer, logic cells from a cell library so as to define a first integrated circuit design, the cell library including a first set of logic cells and a second set of logic cells, each cell in the second set of logic cells having a higher soft error resistance than a corresponding cell in the first set of logic cells, each cell in the second set of logic cells performing the same function as the corresponding cell in the first set of logic cells and each cell in the second set of logic cells having the same cell size as the corresponding cell in the first set of logic cells, the first integrated circuit design including logic cells from the first set of logic cells and not including logic cells from the second set of logic cells;
- testing, using a computer program operable on the computer, to determine critical path timing of the first integrated circuit design;
- replacing, using the computer program operable on the computer, some of the logic cells in the first integrated circuit design with corresponding logic cells in the second set of logic cells;
- testing, using the computer program operable on the computer, to determine whether critical path timing is greater than the critical path timing of the first integrated circuit design; and
- continuing to perform the replacing and the testing, but not replacing those logic cells in the first integrated circuit design that generate a soft error resistant design having critical path timing that is greater than the critical path timing of the first integrated circuit design, so as to generate a soft error resistant design having critical path timing that is not greater than the critical path timing of the first integrated circuit design.

17. The method of claim 16 wherein the first set of logic cells includes a first set of AND cells, a first set of NAND cells, a first set of OR cells and a first set of NOR cells and further wherein the second set of logic cells includes a second set of AND cells, a second set of NAND cells, a second set of OR cells and a second set of NOR cells, each cell in said second set of logic cells having higher soft error resistance than a corresponding cell in the first set of logic cells and each cell in the second set of logic cells performing the same function as the corresponding cell in the first set of logic cells and having the same cell size as the corresponding cell in the first set of logic cells, each logic cell in the second set of AND cells having higher soft error resistance that a corresponding cell in the first set of AND cells, each logic cell in the second set of NAND cells having higher soft error resistance than a corresponding cell in the first set of NAND cells, each logic cell in the second set of OR cells having higher soft error resistance than a corresponding cell in the first set of OR cells and each logic cell in the second set of NOR cells having higher soft error resistance than a corresponding cell in the first set of NOR cells.

18. The method of claim 16 wherein each cell in the second set of logic cells has approximately the same voltage threshold as the corresponding cell in the first set of logic cells.

19. The method of claim 16 wherein each of the cells in the second set of logic cells have approximately the same drive strength as the corresponding cell in the first set of logic cells.

20. A method as recited in claim 16 wherein the first integrated circuit design includes a memory core and wherein the soft error resistant design that has critical path timing that is not greater than the critical path timing of the first integrated circuit design includes the same memory core.

* * * * *

UNITED STATES PATENT AND TRADEMARK OFFICE
CERTIFICATE OF CORRECTION

| | | |
|---|---|---|
| PATENT NO. | : 7,921,400 B1 | Page 1 of 1 |
| APPLICATION NO. | : 12/478734 | |
| DATED | : April 5, 2011 | |
| INVENTOR(S) | : Chuen-Der Lien and Shih-Ked Lee | |

It is certified that error appears in the above-identified patent and that said Letters Patent is hereby corrected as shown below:

Claim 17, line 13 "that" should read --than--.

Signed and Sealed this
Twenty-fourth Day of May, 2011

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,921,400 B1 | |
| APPLICATION NO. | : 12/478734 | |
| DATED | : April 5, 2011 | |
| INVENTOR(S) | : Chuen-Der Lien and Shih-Ked Lee | |

It is certified that error appears in the above-identified patent and that said Letters Patent is hereby corrected as shown below:

Claim 17, Column 11, line 13 "that" should read --than--.

This certificate supersedes the Certificate of Correction issued May 24, 2011.

Signed and Sealed this
Twenty-first Day of June, 2011

David J. Kappos
*Director of the United States Patent and Trademark Office*